(12) United States Patent
Ueda et al.

(10) Patent No.: US 10,944,143 B2
(45) Date of Patent: Mar. 9, 2021

(54) NON-RECIPROCAL CIRCUIT ELEMENT AND METHOD FOR MANUFACTURING THE SAME

(71) Applicant: MITSUBISHI ELECTRIC CORPORATION, Tokyo (JP)

(72) Inventors: Tetsuya Ueda, Tokyo (JP); Hironobu Shibata, Tokyo (JP); Yukinobu Tarui, Tokyo (JP); Hidenori Ishibashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/090,691

(22) PCT Filed: Apr. 21, 2017

(86) PCT No.: PCT/JP2017/015982
§ 371 (c)(1),
(2) Date: Oct. 2, 2018

(87) PCT Pub. No.: WO2017/188131
PCT Pub. Date: Nov. 2, 2017

(65) Prior Publication Data
US 2019/0123413 A1 Apr. 25, 2019

(30) Foreign Application Priority Data
Apr. 27, 2016 (JP) .............................. JP2016-088825

(51) Int. Cl.
| H01P 1/387 | (2006.01) |
| H01P 1/383 | (2006.01) |
| H01P 11/00 | (2006.01) |
| H05K 1/11 | (2006.01) |
| H05K 1/14 | (2006.01) |

(Continued)

(52) U.S. Cl.
CPC ................ H01P 1/383 (2013.01); H01P 1/30 (2013.01); H01P 1/387 (2013.01); H01P 11/00 (2013.01);
(Continued)

(58) Field of Classification Search
CPC ...... H01P 1/32; H01P 1/36; H01P 1/38; H01P 1/387; H01P 1/383
(Continued)

(56) References Cited

U.S. PATENT DOCUMENTS

| 5,218,234 A | 6/1993 | Thompson et al. |
| 5,618,611 A | 4/1997 | Jin et al. |

(Continued)

FOREIGN PATENT DOCUMENTS

| EP | 3057173 A1 | 8/2016 |
| JP | 2006339553 A | 12/2006 |

(Continued)

OTHER PUBLICATIONS

Extended European Search Report for corresponding European Application No. 17789414.4, dated Mar. 19, 2019, 9 pages.

(Continued)

*Primary Examiner* — Stephen E. Jones
(74) *Attorney, Agent, or Firm* — Buchanan Ingersoll & Rooney PC

(57) ABSTRACT

In a non-reciprocal circuit element, a permanent magnet is connected to one main surface of a magnetic plate, and a circuit board is connected to the other main surface of the magnetic plate, with a solder bump lying between the circuit board and the other main surface. The permanent magnet can control the transmission of electrical signal from each of a plurality of signal conductors of circuit board to a corresponding one of a plurality of input/output terminals of the magnetic plate. The non-reciprocal circuit element further (Continued)

includes an underfill material arranged between the magnetic plate and the circuit board. The magnetic plate has a through hole formed therein, the through hole extending from one main surface to the other main surface. The through hole has an empty space in which at least a part of a conductive film arranged in the through hole is exposed.

9 Claims, 13 Drawing Sheets

(51) Int. Cl.
    *H01P 1/30*     (2006.01)
    *H05K 3/34*     (2006.01)

(52) U.S. Cl.
    CPC ............. *H05K 1/115* (2013.01); *H05K 1/141* (2013.01); *H05K 3/3436* (2013.01); *H05K 2201/049* (2013.01); *H05K 2201/086* (2013.01); *H05K 2201/09581* (2013.01); *H05K 2201/10977* (2013.01)

(58) Field of Classification Search
    USPC ................................................ 333/1.1, 24, 2
    See application file for complete search history.

(56) References Cited

U.S. PATENT DOCUMENTS

| | | | |
|---|---|---|---|
| 6,476,331 B1* | 11/2002 | Kim | ................... H01L 21/4846 174/255 |
| 2010/0159193 A1 | 6/2010 | Young et al. | |
| 2014/0301054 A1* | 10/2014 | Nagai | ..................... H01L 33/62 361/761 |
| 2014/0345913 A1* | 11/2014 | Seo | ...................... H05K 1/0373 174/251 |
| 2016/0211564 A1 | 7/2016 | Ishibashi et al. | |

FOREIGN PATENT DOCUMENTS

| | | | |
|---|---|---|---|
| JP | 2015015289 A | | 1/2015 |
| JP | 2016-048752 A | | 4/2016 |
| WO | 2015053213 A1 | | 4/2015 |
| WO | 2016151847 A1 | | 9/2016 |

OTHER PUBLICATIONS

International Search Report (PCT/ISA/210) dated Jul. 18, 2017, by the Japan Patent Office as the International Searching Authority for International Application No. PCT/JP2017/015982.

Written Opinion (PCT/ISA/237) dated Jul. 18, 2017, by the Japan Patent Office as the International Searching Authority for International Application No. PCT/JP2017/015982.

Office Action (Communication pursuant to Article 94(3) EPC) dated Mar. 5, 2020, by the European Patent Office in corresponding European Patent Application No. 177894144. (5 pages).

Office Action (Communication under Rule 71(3) EPC) dated Nov. 26, 2020, by the European Patent Office in corresponding European Patent Application No. 17789414.4. (54 pages).

\* cited by examiner

NON-RECIPROCAL CIRCUIT ELEMENT AND METHOD FOR MANUFACTURING THE SAME

TECHNICAL FIELD

The present invention relates to a non-reciprocal circuit element and a method for manufacturing the same.

BACKGROUND ART

In general, a circuit board of a microwave device, such as a microwave amplifier and a microwave generator, is mourned with a non-reciprocal circuit element, such as an isolator or a circulator. With the decreases in size and weight of the circuit board of the microwave device, it is required that the element body of the non-reciprocal circuit element of this type is a small-sized and thin-walled one that is simpler in structure and better in ease of assembly than a conventional one, and that is capable of being surface-mourned on the circuit board.

For example, WO 2015/53213 (PTD 1) introduces a structure, as a surface-mounted non-reciprocal circuit element excellent in ease of assembly, in which a magnetic plate provided with solder bumps is connected to a circuit board by flip-chip mounting. In WO 2015/53213, in order to provide electrical conduction between the permanent magnet side and the solder bump side of the magnetic plate, through holes are formed extending from one main surface to the other main surface of the magnetic plate, each through hole being filled with a conductive film. According to such a structure, a general-purpose mounter or other equipment can be used to assemble the non-reciprocal circuit element as in the case of the other electronic components mounted on the circuit board, and thus the man-hour for assembling can be reduced through the automatic mounting.

CITATION LIST

Patent Document

PTD 1: WO 2015/53213

SUMMARY OF INVENTION

Technical Problem

Filling the overall through hole with a metallic material as in the structure disclosed in WO 2015/53213, however, disadvantageously requires a long time to work on the magnetic plate, for example, to deposit the metallic material.

If, for example the inner wall surface of each through hole is coated with a conductive film and the through hole is filled with a resin material, then there is a large difference in coefficient of thermal expansion between the magnetic plate and the resin material, which may cause a thermal contraction of the resin material. Thus, the conductive film on the inner wall surface of the through hole may be dragged off by the resin material and peeled off.

In order to obtain a good adhesiveness of the conductive film to the through hole, it is preferred that the inner wall surface of the through hole have consistent and little surface roughness. It is difficult, however, to obtain a consistent surface roughness because of the fragility of a ferritic sintered material that is commonly used as a material of the magnetic plate. Therefore, such a problem regarding the adhesiveness of the conductive film to the through hole is specific to a non-reciprocal circuit element that has a ferritic material.

An object of the present invention, which has been made in view of such a problem, is to provide a non-reciprocal circuit element and a method for manufacturing the same that require only a short processing time and that have a consistent-quality conductive film on the inner wall surface of a through hole formed in a magnetic plate.

Solution to Problem

A non-reciprocal circuit element of the present invention includes a magnetic plate, a permanent magnet, and a circuit board. The permanent magnet is connected to one main surface of the magnetic plate, and the circuit board is connected to the other main surface of the magnetic plate, with a solder bump lying between the circuit board and the other main surface. The non-reciprocal circuit element further includes an underfill material arranged between the magnetic plate and the circuit board. The magnetic plate has a through hole formed therein, the through hole extending from the one main surface to the other main surface. The through hole has an empty space in which at least a part of a conductive film arranged in the through hole is exposed.

In a method for manufacturing a non-reciprocal circuit element of the present invention, a magnetic plate is formed first. A through hole extending from the one main surface to the other main surface of the magnetic plate is formed. A permanent magnet is connected to the one main surface of the magnetic plate. A circuit board is connected to the other main surface of the magnetic plate, with a solder bump lying between the circuit board and the other main surface. An underfill material is supplied between the magnetic plate and the circuit board. In the supplying of the underfill material, the underfill material is supplied in such a way that the through hole formed in the magnetic plate at least partially has an empty space.

Advantageous Effects of Invention

According to the present invention, since the through hole formed in the magnetic plate is not filled with a conductive film, an increased processing time is not required. Further, since the through hole is not filled with a resin material, there is less risk of peeling-off of the conductive film that covers the inner wall surface of the through hole, thus achieving the consistency in quality.

DESCRIPTION OF EMBODIMENTS

Embodiments of the present invention are described hereinafter with reference to the drawings.

Embodiment 1

Figure 1:
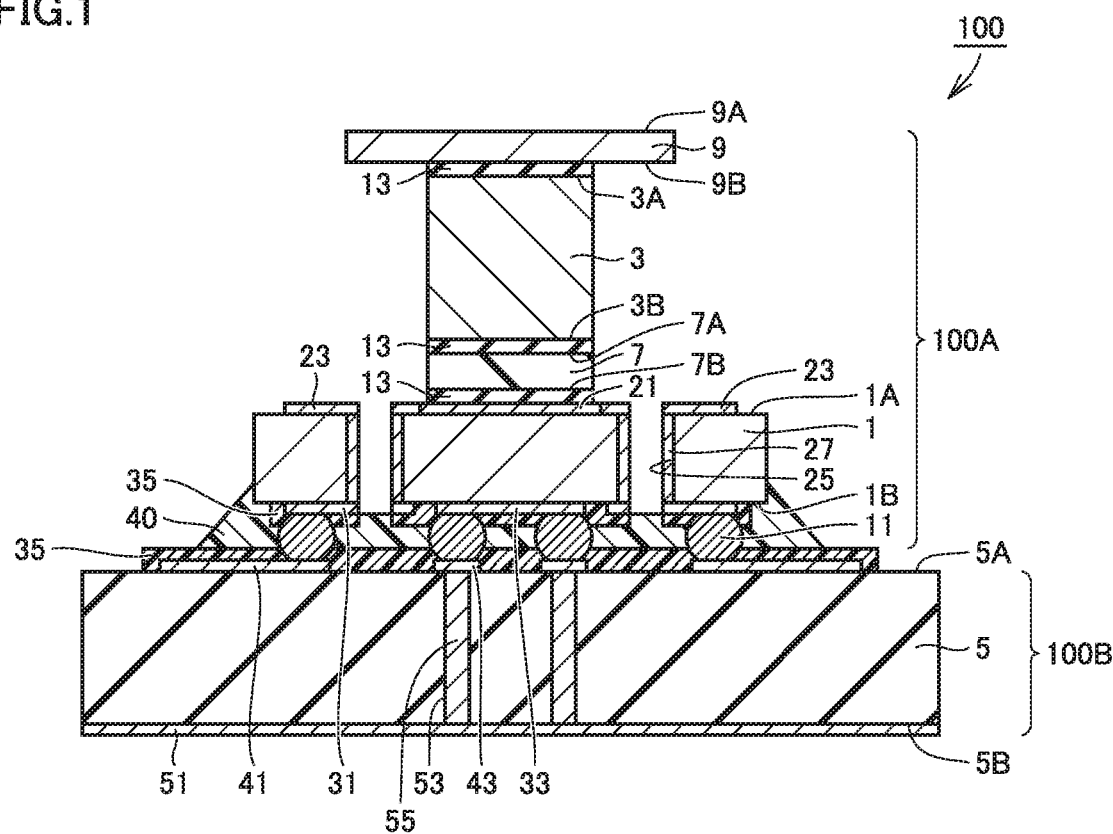
FIG. 1 is a schematic cross-sectional view showing a configuration of a non-reciprocal circuit element in Embodiment 1.
Figure 2:
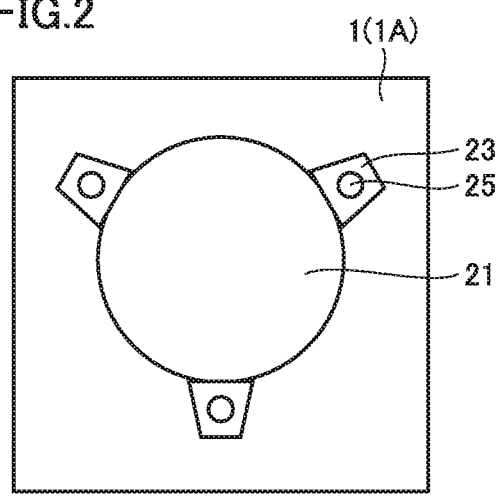
FIG. 2 is a schematic plan view showing one main surface side of the magnetic plate in FIG. 1, as seen in plan view.
Figure 3:
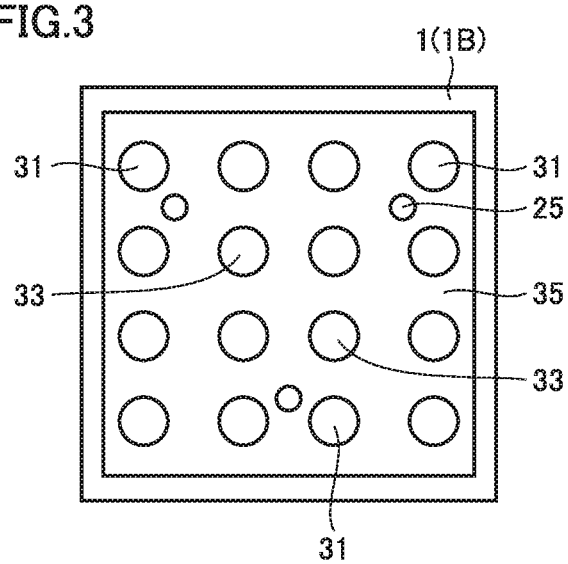
FIG. 3 is a schematic plan view showing the other main surface side of the magnetic plate in FIG. 1, as seen in plan view.

First, a configuration of a non-reciprocal circuit element in the present embodiment is described with reference to FIG. 1 to FIG. 3. With reference to FIG. 1 to FIG. 3, a non-reciprocal circuit element 100 in the present embodiment includes an element body 100A and a mounting board 100B. Element body 100A mainly includes a magnetic plate 1, a magnet 3, a dielectric component 7, a magnetic yoke 9, and a solder bump 11. Element body 100A is configured with these components and later-described members. As mounting board 100B, a circuit board 5 is provided where later-described members are provided.

Next, the members and the configuration of element body 100A are described. Magnetic plate 1 has one main surface 1A and the other main surface 1B. One main surface 1A is the main surface on the upper side in FIG. 1, and the other main surface 1B is the main surface on the side opposite to one main surface 1A. i.e., on the lower side in FIG. 1. Magnetic plate 1 is made of, for example, any of a metallic material containing iron as a chief ingredient, ferrite, and a composite magnetic material containing a magnetic powder and a resin material mixed together. Among the above materials, a ferritic material is particularly preferably used to form magnetic plate 1. As magnetic plate 1 in the present embodiment, a rare-earth garnet ferrite, known as a material with a low magnetic loss in a high-frequency area, is used.

Magnetic plate 1 is preferably in the form of a flat plate that is rectangular or square in shape as seen in plan view, i.e., in the form of a rectangular parallelepiped, for example. For example, magnetic plate 1 in the present embodiment is a 4.0-mm square in shape as seen in plan view, with a thickness (i.e., the distance between one main surface 1A and the other main surface 1B) of 0.5 mm.

On one main surface 1A of magnetic plate 1, a central electrode 21 is formed. Central electrode 21 is, for example, circular in shape as seen in plan view, and interconnects 23 are formed in such a way as to extend outward from the circumference of central electrode 21. There are three interconnects 23 located at intervals of 120° in the circumferential direction of the circular central electrode 21 with respect to the center of central electrode 21 as seen in plan view. In other words, three interconnects 23 are arranged in such a way that the central angles defined by the three straight lines in the radial direction of central electrode 21 that connect central electrode 21 and three interconnects 23 are each 120°.

On the other main surface 1B of magnetic plate 1, a plurality of input/output terminals 31 and a grounding electrode 33 are formed. For example, three input/output terminals 31 are formed at the positions that generally coincide with interconnects 23 as seen in plan view. Thus, each of a plurality of interconnects 23 is connected to a corresponding one of a plurality of input/output terminals 31. Grounding electrode 33 is formed at the position that generally coincide with central electrode 21 as seen in plan view, for example. Alternatively, for example, grounding electrode 33 may be formed in such a way as to cover the entire surface of the other main surface 1B.

On the other main surface 1B, a solder resist 35 is formed in such a way as to cover the surfaces of input/output terminals 31 and grounding electrode 33. Solder resist 35 is made of a metallic material (e.g., chromium) or an epoxy resin material. In the present embodiment, epoxy resin solder resist 35 is used.

Areas of input/output terminals 31 and grounding electrode 33 exposed at solder resist 35, i.e., areas of input/output terminals 31 and grounding electrode 33 exposed through opening portions formed in solder resist 35 serve as pad electrodes.

Central electrode 21, interconnects 23, input/output terminals 31, and grounding electrode 33 formed on magnetic plate 1 are preferably made of copper foil having a thickness of, for example, not less than 40 μm and not more than 70 μm.

In magnetic plate 1, through hole 25 is formed extending from one main surface 1A to the other main surface 1*b*.

Through hole 25 extends, for example, from an area of one main surface 1A that partially overlaps interconnect 23 in plan view (see FIG. 2) to input/output terminal 31 on the other main surface 1B. On the inner wall surface of through hole 25, a conductive film 27 is formed. Conductive film 27 may be made of the same copper foil as that of interconnects 23.

Magnetic plate 1 which has the above-described configuration is a member for producing magnetic resonance of microwaves therein.

Magnet 3 is a member as a permanent magnet that is connected to one main surface 1A of magnetic plate 1 with dielectric component 7 lying therebetween. Similarly to magnetic plate 1, magnet 3 has one main surface 3A (the upper side in FIG. 1) and the other main surface 3B on the side opposite to one main surface 3A (the lower side in FIG. 1). Magnet 3 is a member arranged for use of a direct-current magnetic field at element body 100A. Magnet 3 is made of, for example, any of a ferritic material, a samarium cobalt material, and a neodymium-iron-boron material. In the present embodiment, magnet 3 is made of a samarium cobalt material, which is high in Curie temperature and high in corrosion resistance. Magnet 3 is, for example, circular in shape as seen in plan view, with a diameter of 3.0 mm and a thickness of 1.0 mm, for example.

Magnet 3 is a member that applies a bias magnetic field so as to control the transmission of electrical signal from each of a plurality of signal conductors to a corresponding one of three input/output terminals 31 of magnetic plate 1, the plurality of signal conductors being arranged at later-described circuit board 5 below magnet 3. Specifically, for example, magnet 3 transfers a signal, which has been input from a first one of live three signal conductors to a first one of three input/output terminals 31, to a second input/output terminal 31 (i.e., one of the remaining input/output terminals 31) and then outputs the transferred signal to a second signal conductor, with almost no attenuation of the signal. On the other hand, magnet 3 transfers a significantly attenuated signal to a third input/output terminal 31 (i.e., another one of the remaining input/output terminals 31) and outputs a significantly attenuated signal to a third signal conductor. Through such an operation, magnet 3 provides a one-direction magnetic field to the inside of magnetic plate 1, or rotates the transmission path of microwave which has been input from an input/output terminal, to a specific-direction input/output terminal 31.

Dielectric component 7 is a member connected in such a way as to lie between magnetic plate 1 and magnet 3. Similarly to the other members, dielectric component 7 has one main surface 7A (the upper side in FIG. 1) and the other main surface 7B on the side opposite to one main surface 7A (the lower side in FIG. 1). As a material constituting dielectric component 7, a material low in dielectric loss is preferably used. Specifically, dielectric component 7 is made of, for example, any of a resin material (e.g., polyimide or polytetrafluoroethylene (PTFE)) and alumina. In the present embodiment, dielectric component 7 is made of polytetrafluoroethylene. Dielectric component 7 is, for example, circular in shape as seen in plan view, with a diameter of 3.0 mm and a thickness of 0.2 mm, for example. However, dielectric component 7 does not necessarily have to be a flat plate circular in shape as seen in plan view, but may be a flat plate rectangular or square in shape as seen in plan view.

Magnetic yoke 9, which is arranged on one main surface 3A of magnet 3, is a member that controls the path of line of magnetic force and brings about not only the electromagnetic shielding effect but also the effect of curbing the influence of magnetism at the time of surface mounting with a chip mounter or the like. Similarly to the other members, magnetic yoke 9 has one main surface 9A (the upper side in FIG. 1) and the other main surface 9B on the side opposite to one main surface 9A (the lower side in FIG. 1). In the present embodiment, a disc-shaped member made of pure iron with a nickel-plated surface for rust prevention is used as magnetic yoke 9. Further, magnetic yoke 9 in the present embodiment has a diameter of 3.5 mm and a thickness of 0.2 mm, for example. Note that magnetic yoke 9 does not necessarily have to be in the disc shape, but may be, for example, polygonal in shape as seen in plan view. Further, magnetic yoke 9 is not necessarily connected to magnet 3, but may be, for example, in the form of a cap covering one main surface 3A of magnet 3.

Magnetic plate 1, magnet 3, dielectric component 7, and magnetic yoke 9 as described above are bonded and integrated together with adhesive sheets 13 as an adhesive agent. Each adhesive sheet 13 is a flat-plate member. Each adhesive sheet 13 adheres to one or the other main surface of a relevant one of magnetic plate 1, magnet 3, dielectric component 7, and magnetic yoke 9, thereby bonding these members together. Specifically, adhesive sheet 13 adheres to one main surface 1A (central electrode 21) of magnetic plate 1 and to the other main surface 7B of dielectric component 7 located immediately above magnetic plate 1, thereby bonding magnetic plate 1 and dielectric component 7 together. Also, adhesive sheet 13 adheres to one main surface 7A of dielectric component 7 and in the other main surface 3B of magnet 3 located immediately above dielectric component 7, thereby bonding dielectric component 7 and magnet 3 together. Further, adhesive sheet 13 adheres to one main surface 3A in magnet 3 and to the other main surface 9B of magnetic yoke 9 located immediately above magnet 3, thereby bonding magnet 3 and magnetic yoke 9 together.

As adhesive sheets 13, a thermosetting adhesive agent or a thermoplastic adhesive agent is preferably used. The plurality of adhesive sheets 13 may be of different product numbers, in consideration of the wettability for the adherend, the difference in coefficient of thermal expansion and/or other factors. In the present embodiment however, all adhesive sheets 13 are made of an epoxy adhesive agent having the same thermosetting properties. In the present embodiment, all adhesive sheets 13 are the same in size. Specifically each adhesive sheet 13 is circular in shape a diameter of 3.0 mm as seen in plan view, and has a thickness of 0.05 mm. Note that the thickness of adhesive sheets 13, which affects the dielectric loss, is determined as above in consideration of the thickness in dielectric component 7. Further, each adhesive sheet 13 may be made of any insulating material that can bond and fix the members and that provides electrical insulation between the bonded and fixed members. For example, as adhesive sheets 13, a one-component adhesive agent or a two-component adhesive agent may be used.

A plurality of solder bumps 11 are connected to the bottom of the stack of magnetic plate 1, magnet 3, dielectric component 7, and magnetic yoke 9 integrated together with adhesive sheets 13 in FIG. 1, namely, to the other main surface 1B of magnetic plate 1. Solder bumps 11 are used for electrical connection between element body 100A and mounting board 100B. As shown in FIG. 3, solder bumps 11 are joined to the pad electrode portions, i.e., the portions of input/output terminals 31 and grounding electrode 33 that are exposed at solder resist 35, on the other main surface 1B side of magnetic plate 1 (i.e., on the other main surface 1B). In this way, the terminals and electrodes of magnetic plate 1 are electrically connected to solder bumps 11.

Solder bumps 11 are preferably composed of, for example, solder made of an alloy of tin, silver, and copper. For example, solder bumps 11 are preferably made of, but is not limited to Sn3.0Ag0.5Cu. Further, solder bumps 11 are each spherical in shape, for example, and its size is an important factor that determines the gap between magnetic plate 1 and circuit board 5. Accordingly, in consideration of the electrical characteristics between magnetic plate 1 and circuit board 5, the connection reliability, the processing efficiency in mounting solder bumps 11 on circuit board 5 and/or other factors, solder bumps 11 are preferably, but is not limited to 0.65 mm in diameter, for example.

Next, circuit board 5 as mounting board 100B is a flat-plate member that is, for example, rectangular in shape as seen in plan view. Similarly to the other members, circuit board 5 has one main surface 5A (the upper side in FIG. 1) and the other main surface 5B on the side opposite to one main surface 5A (the lower side in FIG. 1). Circuit board 5 is preferably made of a ceramic material or a resin material. Circuit board 5 in the present embodiment is, however, a printed circuit board made of resin, which is lower in dielectric loss than a ceramic material. This can achieve both improved high-frequency properties and a low manufacturing cost of circuit board 5. As to the external dimensions of circuit board 5, it is for example a 50-mm square as seen in plan view, with a thickness the distance between one main surface 5A and the other main surface 5B of 1.7 mm.

Pad electrodes 41 as a plurality of signal conductors and circuit-board central electrodes 43 are formed on circuit board 5. Specifically, pad electrodes 41 as a plurality of signal conductors and circuit-board central electrodes 43 are formed on one main surface 5A of circuit board 5. As to pad electrodes 41, a total of three pad electrodes 41 are provided at intervals of 120° in the circumferential direction of a virtual circle that is drawn on one main surface 5A centering around the center of one main surface 5A as seen in plan view, although not shown. In other words, three pad electrodes 41 are arranged it the direction that coincide with interconnects 23 of magnetic plate 1 in plan view. As to circuit-board central electrodes 43, a plurality of circuit-board central electrodes 43 are provided at intervals at parts of the area that coincides with grounding electrode 33 of magnetic plate 1 in plan view.

On one main surface 5A, solder resist 35 is formed in such a way as to cover the surfaces of pad electrodes 41 and circuit-board central electrodes 43, similarly to the other main surface 1B of magnetic plate 1. Solder resist 35, however, has opening portions at the areas that coincide with pad electrodes 41 and circuit-board central electrodes 43, so that pad electrodes 41 and circuit board central electrodes 43 are exposed at solder resist 35.

The exposed pad electrodes 41 and circuit-board central electrodes 43 are joined to solder bumps 11. Thus, magnetic plate 1 and circuit board 5 are electrically connected. Such a connection system between element body 100A and mounting board 100B using solder bumps 11 is called a ball grid array (BGA). Although there is a large difference in coefficient of thermal expansion between magnetic plate 1 and circuit board 5 connected to each other, the BGA can reduce the thermal stress between magnetic plate 1 and circuit board 5.

On the surfaces of pad electrodes 41 and circuit-board central electrodes 43 at the above-described opening portions in solder resist 35, formed is a stack of: a nickel plating film with a thickness of not less than 3 μm and not more than 5 μm; and a gold plating film with a thickness of not less than 0.02 μm and not more than 0.05 μm. The purpose of this plating film is to prevent oxidation of pad electrodes 41 and the like, and to improve the wettability of solder bumps 11 thereon. Such nickel and gold plating films may be formed also on the surfaces of input/output terminals 31 and grounding electrode 33 of magnetic plate 1.

Besides, a back-side electrode 51 is formed on the other main surface 5B of circuit board 5 in such a way as to cover, for example, its whole surface. In circuit board 5, through hole 53 is formed extending from circuit-board central electrodes 43 on one main surface 5A to back-side electrode 51 on the other main surface 5B. In through hole 53, a conductive film 55 is formed for electrical connection between one main surface 5A and the other main surface 5B via through hole 53.

Pad electrodes 41, circuit-board central electrodes 43, and back-side electrode 51 on circuit board 5 are each preferably made of a copper foil with a thickness of, for example, not less than 40 μm and not more than 70 μm. Each conductive film 55 may also be made of the same copper foil as circuit-board central electrodes 43.

As described above, element body 100A is mounted on one main surface 5A of circuit board 5 (mounting board 100B), with solder bumps 11 lying therebetween, thus forming non-reciprocal circuit element 100. Conversely speaking, circuit board 5 is connected to the other main surface 1B of magnetic plate 1, with solder bumps 11 lying therebetween. An underfill material 40 is arranged at the area adjacent to where solder bumps 11 are disposed, i.e., the area generally between the other main surface 1B of magnetic plate 1 and one main surface 5A of circuit board 5. Underfill material 40 is a resin material that fills the gap between magnetic plate 1 and circuit board 5 for relaxation of stress on solder bumps 11.

Common underfill material 40 is made of a material selected from the group consisting of a base resin, a hardening agent, a hardening accelerator, a filler, an organic solvent, and a carbon black. A material with an appropriate coefficient of thermal expansion, glass-transition temperature, and viscosity is selected in accordance with the configuration of the product and the standard of a long-term reliability test. In the present embodiment, gelatinous underfill material 40 is used containing, for example, an epoxy resin of bisphenol A and bisphenol F as a base resin, with a fused silica ($SiO_2$) as a filler component of not less than 40% by weight and not more than 60% by weight. The fused silica, a factor that affects the permeability of underfill material 40, is preferably composed of a spherical molecule with a diameter of for example not less than 5 μm and not more than 30 μm ad has a viscosity of not less than 5 Pa·s and not more than 20 Pa·s. Further, underfill material 40 is preferably of a solventless type from the viewpoint of prevention of void generation in underfill material 40 due to volatilization of the organic solvent during heat curing.

This underfill material 40 is arranged in such a way as to fill the area between magnetic plate 1 and circuit board 5. Underfill material 40, however, may also cover at least a part of the side surface of magnetic plate 1 that intersects one main surface 1A, as shown in FIG. 1. The angle of the side wall (i.e., a side fillet described later, or the outermost edge) of underfill material 40, which includes the portion where underfill material 40 covers the side surface of magnetic plate 1, relative to one main surface 1A of magnetic plate 1 and one main surface 5A of circuit board 5 is preferably not less than 10° and not more than 45°. The height of this side wall, i.e., the thickness of underfill material 40 at its thickest area, is preferably not less than one time and not more than two times the distance between the other main surface 1B of magnetic plate 1 and one main surface 5A of circuit board 5, i.e., the vertical dimension of the gap in FIG. 1. Further, the viscosity of underfill material 40 as a whole is preferably not less than 1 Pa·s, and is coefficient of thermal expansion is preferably not more than 30 ppm/° C.

Figure 4:
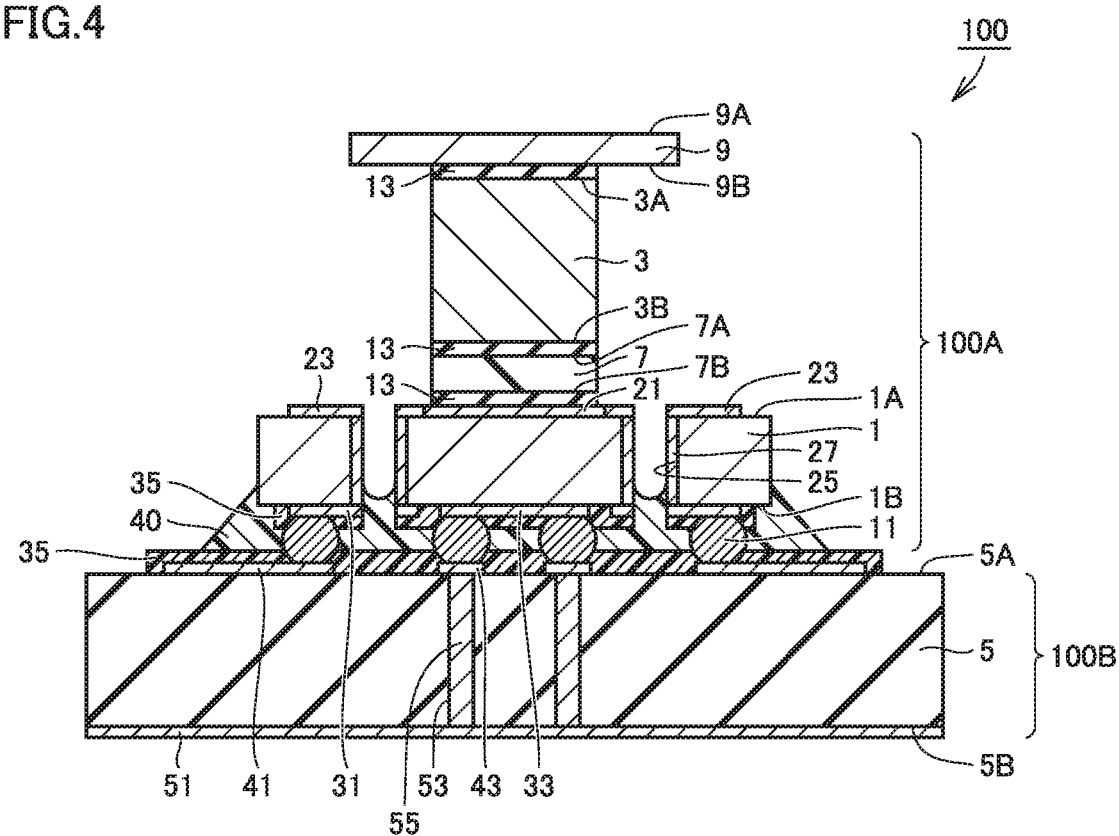
FIG. 4 is a schematic cross-sectional view showing a mode in which an underfill material has entered a part of a through hole of the non-reciprocal circuit element in FIG. 1.

Underfill material 40 preferably has a thickness larger than the distance of the gap between magnetic plate 1 and circuit board 5, with underfill material 40 covering the side surface of magnetic plate 1 as described above. In non-reciprocal circuit element 100, however, through hole 25 in magnetic plate 1 at least partially has an empty space. Specifically, through hole 25 has no underfill material 40 entering therein and merely has thin conductive film 27 that covers the inner wall surface of through hole 25. That is, through hole 25 is basically an empty space filled with air and the like. Some amount of underfill material 40 entering through hole 25 is allowable if it does not affect the adhesiveness between conductive film 27 and through hole 25 and if conductive film 27 is exposed in the empty space, with reference to FIG. 4. The ratio of the depth of the area where underfill material 40 has entered through hole 25 to the thickness of magnetic plate 1 is preferably not more than 50%.

Next, a method for manufacturing non-reciprocal circuit element 100 in the present embodiment is described with reference to FIG. 5 to FIG. 16.

Figure 5:
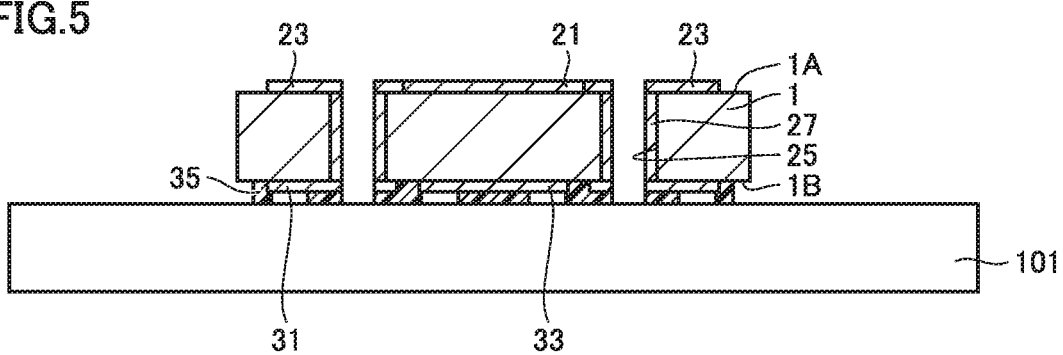
FIG. 5 is a schematic cross-sectional view showing a first step in a method for manufacturing the non-reciprocal circuit element in Embodiment 1.

With reference to FIG. 5, magnetic plate 1 that has one main surface 1A and the other main surface 1B on the side opposite to one main surface 1A is prepared. In this magnetic plate 1, through hole 25 is formed extending from one main surface 1A to the other main surface 1B. For the formation of through hole 25, a commonly-known technique such as the sandblasting or the laser machining is used. In the present embodiment, the sandblasting is preferably used from the viewpoint of reduction in the processing cost.

Central electrode 21 and interconnects 23 are formed on one main surface 1A, and a plurality of input/output terminals 31 and grounding electrode 33 are formed on the other main surface 1B. These are formed preferably by a method selected from the commonly-known screen printing, sputtering, vapor deposition, and plating. In the present embodiment, first, a copper thin film is formed by the electrolytic plating on one main surface 1A and the other main surface 1B of a base material of magnetic plate 1, the copper thin film having a thickness of not less than 3 μm and not more than 5 μm, for example. On the surface of the copper thin film, formed is a stack of: a nickel plating film having a thickness of not less than 1 μm and not more than 2 μm; and a gold plating film having a thickness of not less than 0.02 μm and not more than 0.05 μm. The purpose of the formation of the nickel and gold plating films is to prevent oxidation of the copper thin film, and to improve the wettability of solders thereon. By forming these films, conductive film 27 may be formed on the inner wall surface of through hole 25.

The formed films are patterned by the commonly-known photolithography or other techniques. After that, solder resist 35 is formed on the other main surface 1B in such a way as to cover input/output terminals 31 and grounding electrode 33. Note that solder resist 35 is formed with opening portions at areas through which input/output terminals 31 and grounding electrode 33 are to be exposed. If solder resist 35 to be formed is a metallic material (e.g. chromium), low in solder wettability, the sputtering or the vapor deposition is preferably used. If solder resist 35 to be formed is an epoxy resin material, the screen printing is preferably used. In the present embodiment, epoxy resin solder resist 35 is formed by the screen printing.

Magnetic plate 1, which has been formed in this way, is placed on one main surface of a hot plate 101. For example, magnetic plate 1 is placed on hot plate 101 in such a way that solder resist 35 on the other main surface 1B side is in contact with hot plate 101.

Figure 6:
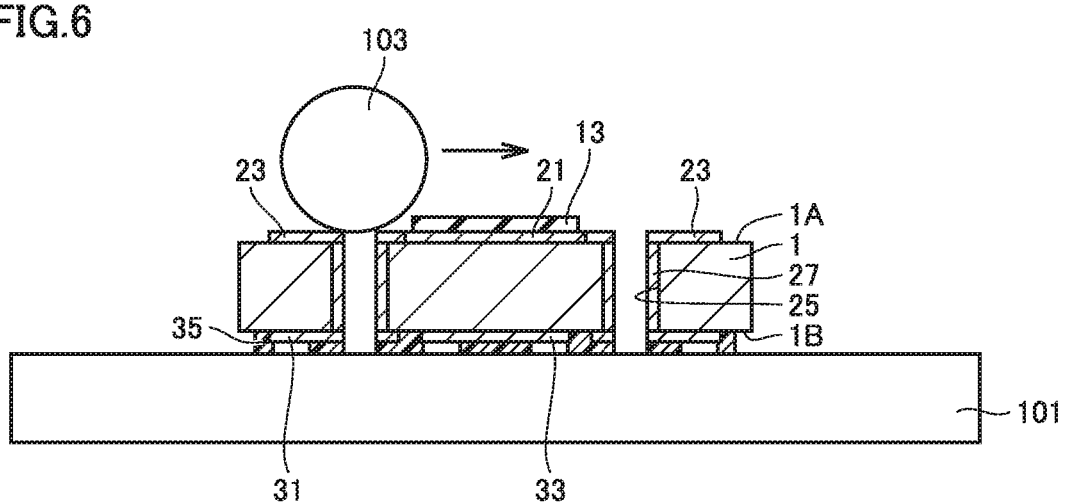
FIG. 6 is a schematic cross-sectional view showing a second step in a method for manufacturing the non-reciprocal circuit element in Embodiment 1.

With reference to FIG. 6, magnetic plate 1 placed on hot plate 101 is heated. Then, after the surface temperature of magnetic plate has become stable at a high temperature, adhesive sheet 13 is put on central electrode 21 of magnetic plate 1, for example. Adhesive sheet 13 used here is obtained by dividing a roll adhesive sheet 13, supplied from a material manufacturer, into individual pieces with the use of a metallic mold or the like.

The tackiness (i.e., the initial adhesiveness of an adhesive) of common adhesive sheet 13 depends on its temperature. Thus, adhesive sheet 13 has both easiness of handling and good adhesiveness. Specifically, at a room temperature, adhesive sheet 13 in the present embodiment is low in tackiness and easy to handle. At a room temperature, however, adhesive sheet 13 is not soft enough to be put on magnetic plate 1 without wrinkling. Thus, when adhesive sheet 13 is to be put onto magnetic plate 1, adhesive sheet 13 is preferably heated to not less than 40° C. and not more than 80° C. to be softened. This can improve the wettability of adhesive sheet 13 for an adherend and provide a high adhesive strength.

From the viewpoint of preventing adhesive sheet 13 from wrinkling when adhesive sheet 13 is put on magnetic plate 1, adhesive sheet 13 is preferably applied with a pressure on magnetic plate 1 using a rubber roller 103. This can further improve the wettability of adhesive sheet 13 on magnetic plate 1 due to the pressure force from roller 103, and can prevent air bubbles from entering the area between adhesive sheet 13 and magnetic plate 1 (central electrode 21). In the present embodiment, silicone rubber roller 103 with a hardness of 60 is preferably used, and roller 103 preferably makes a rotary motion in the horizontal direction in FIG. 6 at a speed of not less than 10 mm/s and not more than 100 mm/s while a pressure of not less than 0.2 MPa and not more than 0.7 MPa is being applied.

More preferably, roller 103 with a heater is used so as to reduce the temperature difference between the area above adhesive sheet 13 and the area below adhesive sheet 13 in FIG. 6.

Figure 7:
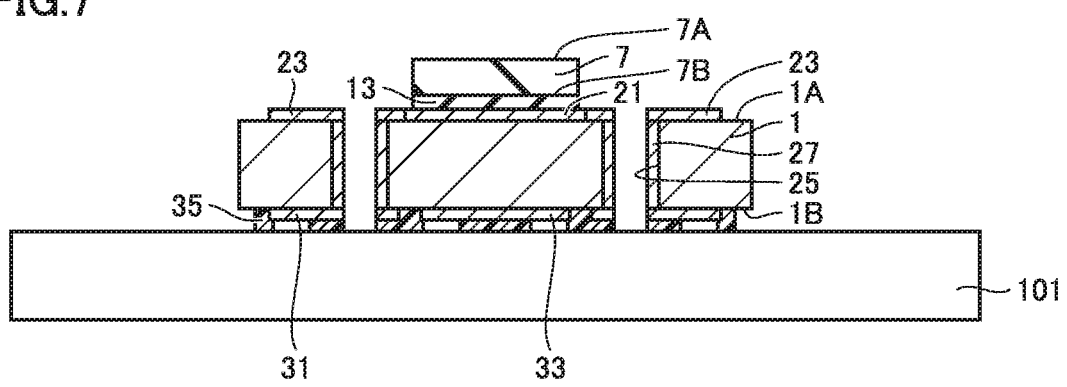
FIG. 7 is a schematic cross-sectional view showing a third step in a method for manufacturing the non-reciprocal circuit element in Embodiment 1.

Next, with reference to FIG. 7, dielectric component 7 is placed on adhesive sheet 13. Dielectric component 7 is placed in such a way that the other main surface 7B adheres to adhesive sheet 13. In this state, a pressure is applied to dielectric component 7 with roller 103 from above, i.e., from the one main surface 7A side, similarly to the step of FIG. 6. This allows adhesive sheet 13 to conform to the other main surface 7B of dielectric component 7. At this time, a positioning jig or the like may be used to place dielectric component 7 on adhesive sheet 13 to prevent a relative misalignment between dielectric component 7 and magnetic plate 1.

Figure 8:
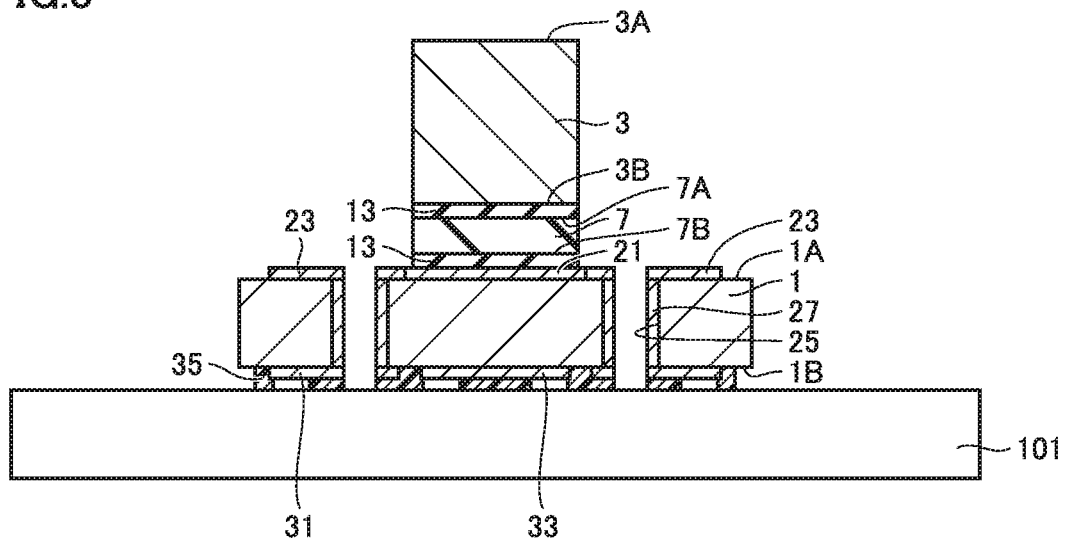
FIG. 8 is a schematic cross-sectional view showing a fourth step in a method for manufacturing the non-reciprocal circuit element in Embodiment 1.

Next, with reference to FIG. 8, adhesive sheet 13 is put on one main surface 7A of dielectric component 7 through a procedure similar to the step of FIG. 6. To the upper surface of sheet 13, magnet 3 is further bonded through a procedure similar to the step of FIG. 7. Here, magnet 3 is attached in such a way that the other main surface 3B of magnet 3 adheres to adhesive sheet 13. In this way, magnet 3 is connected to one main surface 1A of magnetic plate 1.

Figure 9:
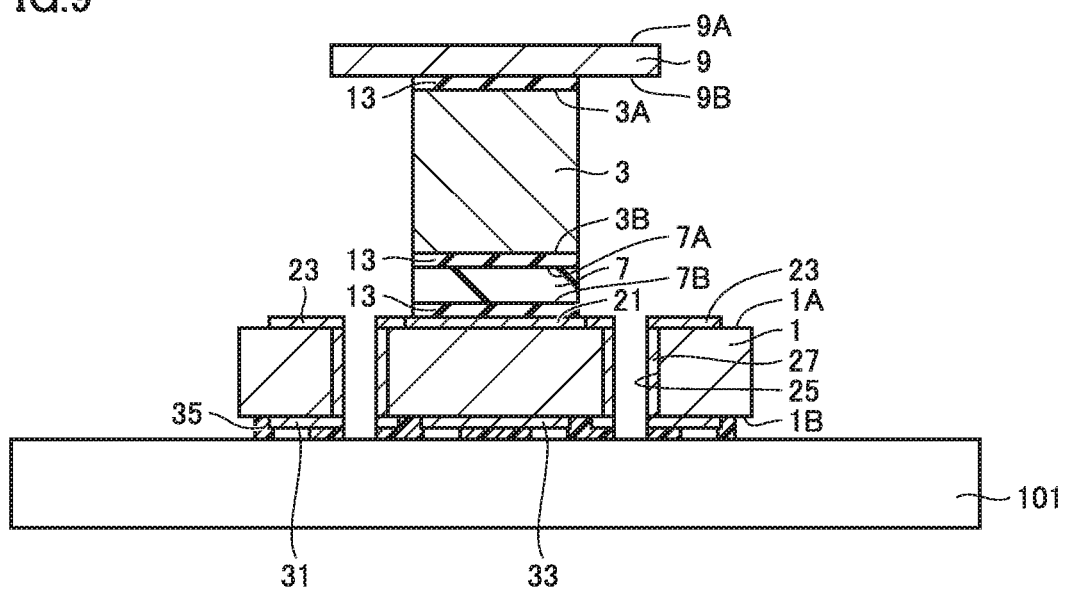
FIG. 9 is a schematic cross-sectional view showing a fifth step in a method for manufacturing the non-reciprocal circuit element in Embodiment 1.

With reference to FIG. 9, adhesive sheet 13 is put on one main surface 3A of magnet 3 through a procedure similar to the step of FIG. 6. To the upper surface of sheet 13, magnetic yoke 9 is further bonded through a procedure similar to the step of FIG. 7. Here, magnetic yoke 9 is attached in such a way that the other main surface 9B of magnetic yoke 9 adheres to adhesive sheet 13. In this way, magnetic yoke 9 is connected to one main surface 1A of magnetic plate 1.

Figure 10:
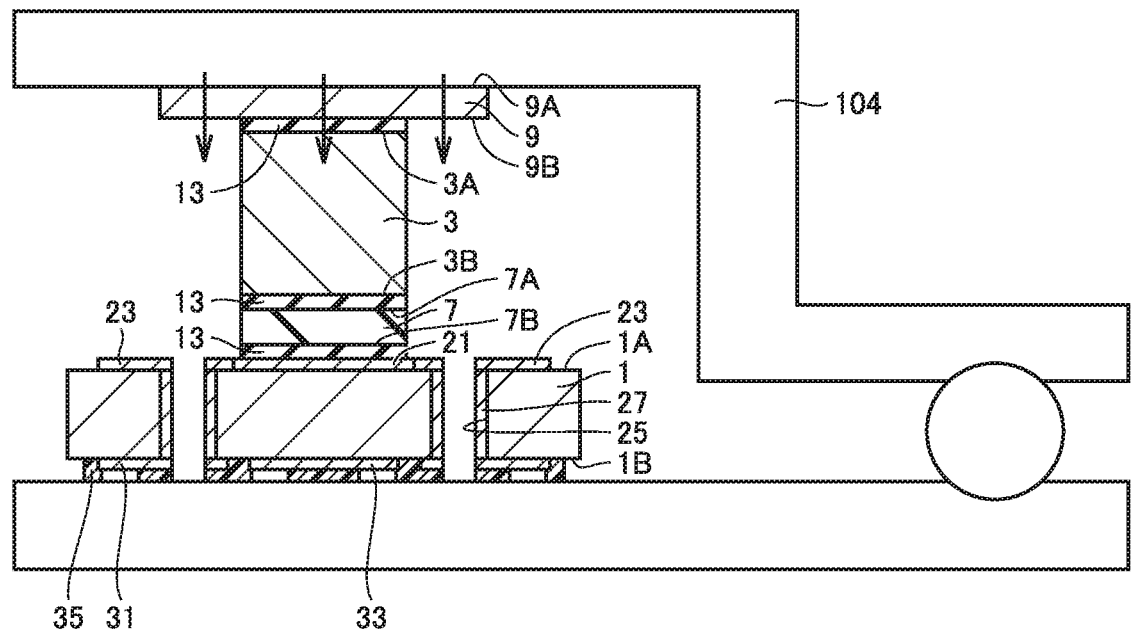
FIG. 10 is a schematic cross-sectional view showing a sixth step in a method for manufacturing the non-reciprocal circuit element in Embodiment 1.

With reference to FIG. 10, a downward pressure is applied from above one main surface 9A of magnetic yoke 9 as indicated by the arrows in FIG. 10 using a pressure clip 104 or the like, after magnetic plate 1, magnet 3, dielectric component 7, and magnetic yoke 9 are integrated together through the step of FIG. 9. The pressure is preferably not less than 0.2 MPa and not more than 1.0 MPa. With such a pressure being applied, the whole system shown in FIG. 10 is put into an oven to be heated at 200° C. for 15 minutes, for example. In this way, adhesive sheets 13 are cured.

Figure 11:
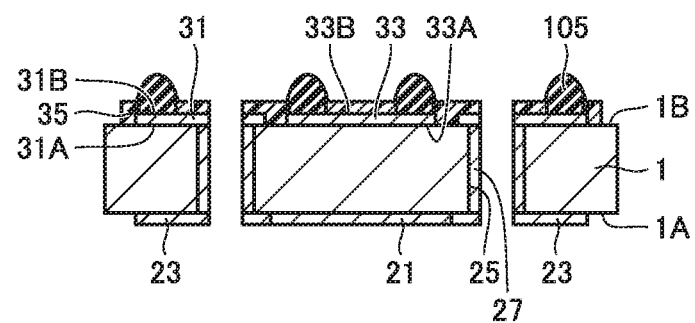
FIG. 11 is a schematic cross-sectional view showing a seventh step in a method for manufacturing the non-reciprocal circuit element in Embodiment 1.
Figure 12:
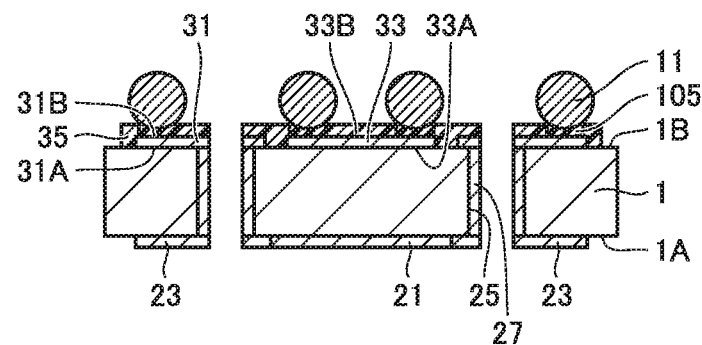
FIG. 12 is a schematic cross-sectional view showing an eighth step in a method for manufacturing the non-reciprocal circuit element in Embodiment 1.

In the subsequent FIG. 11 and FIG. 12, magnet 3, dielectric component 7, magnetic yoke 9, and adhesive sheets 13 are not shown. With reference to FIG. 11 and FIG. 12, solder bumps 11 are connected to the other main surface 1B of magnetic plate 1. Specifically, with reference to FIG. 11, magnetic plate 1 is turned upside down for example, and a flux 105 is supplied particularly to the surfaces of input/output terminals 31 and grounding electrode 33 (pad electrode) exposed through the opening portions in solder resist 35 on the other main surface 1B of magnetic plate 1.

Flux 105 is supplied preferably by the commonly-known screen printing with the use of a mask for printing having a metallic thin film. Flux 105 is preferably of a non-cleaning type with a non-active rosin. Flux 105 is supplied to die surfaces of input/output terminals 31 and grounding electrode 33 (pad electrode), while flux 105 supplied to the mask for priming is being squeezed with a urethane squeegee or the like.

Next, with reference to FIG. 12, solder bumps 11 are placed on flux 105 supplied to the pad electrode in the step of FIG. 11. As a method of mounting solder bumps 11, a mounter or the like may be used to carry solder bumps 11 to flux 105, with solder bumps 11 sticking to the mounter, for example. As an alternative method, solder bumps 11 may be set on a mask having a metallic thin film, and portions of solder bumps 11 that have extruded from the mask may be swept away by a urethane squeegee, so that solder bumps 11 can be supplied to the opening portions in solder resist 35 on the other main surface 1B of magnetic plate 1. The latter method allows easy operations using a simple jig.

After that, heating is performed in a reflow furnace for soldering, so that solder bumps 11 are connected to input/output terminals 31 and grounding electrode 33 at the opening portions in solder resist 35 on the other main surface 1B. Element body 100A is thus formed.

Figure 13:
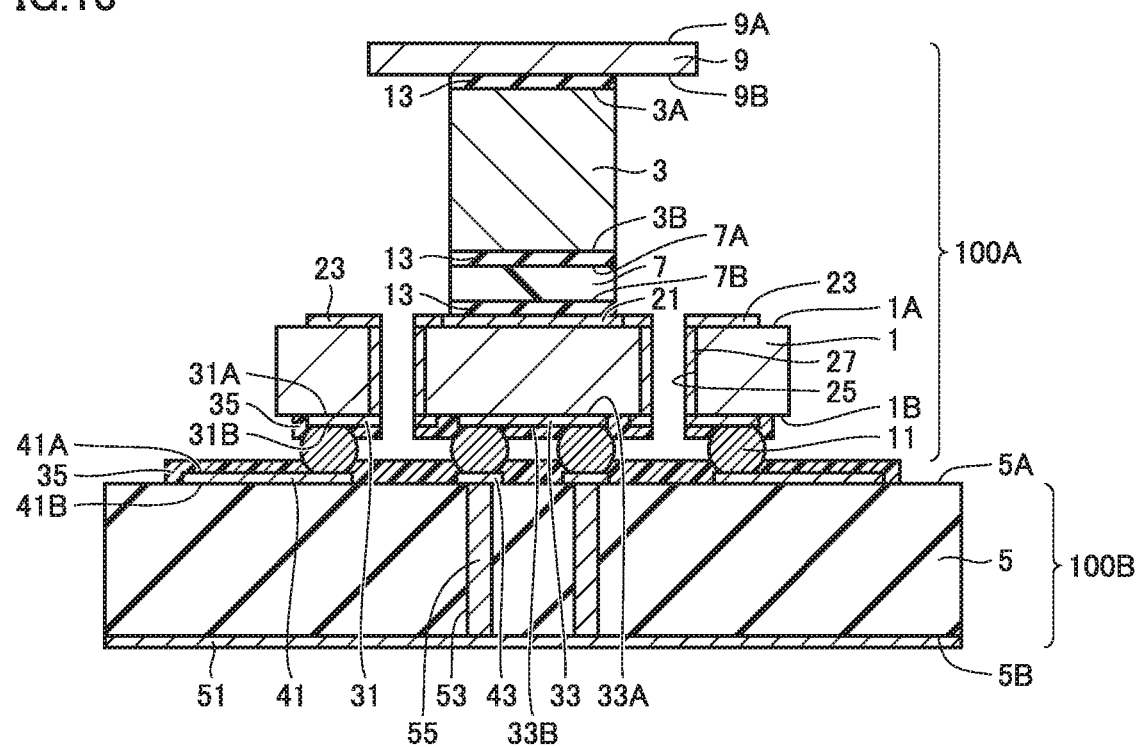
FIG. 13 is a schematic cross-sectional view showing a ninth step in a method for manufacturing the non-reciprocal circuit element in Embodiment 1.

With reference to FIG. 13, circuit board 5 is prepared as mounting board 100B for the above-described element body 100A to be mounted thereon. Circuit board 5 has: one main surface 5A having pad electrodes 41 and circuit-board central electrodes 43 formed thereon; and the other main surface 5B having back-side electrode 51 formed thereon, with through hole 53 and conductive film 55 being formed in the board. Similarly to solder resist 35 and flux 105 formed on the above-described other main surface 1B, a pattern of solder resist 35 is formed on one main surface 5A of circuit board 5 by the commonly-known screen printing. Solder resist 35 has opening portions at the portions to be connected to solder bumps 11, so that pad electrodes 41 and circuit-board central electrodes 43 are exposed through the opening portions. On the surfaces of exposed pad electrodes 41 and circuit-board central electrodes 43, a thin film of solder paste is formed by printing, although not shown.

The whole element body 100A formed as in FIG. 12 is turned upside down again, so that solder bumps 11 connected to magnetic plate 1 are placed in contact with the opening areas in solder resist 35 where pad electrodes 41 and circuit-board central electrodes 43 are exposed. In this state, heating is performed in a reflow furnace for soldering, so that solder bumps 11 are connected to pad electrodes 41 and circuit-board central electrodes 43 of circuit board 5. Element body 100A is thus connected to or mounted on mounting board 100B.

Through the steps of FIG. 11 to FIG. 13 described above, circuit board 5, which has pad electrodes 41 as a plurality of signal conductors, is connected to the other main surface 1B of magnetic plate 1 with solder bumps 11 lying therebetween.

Figure 14:
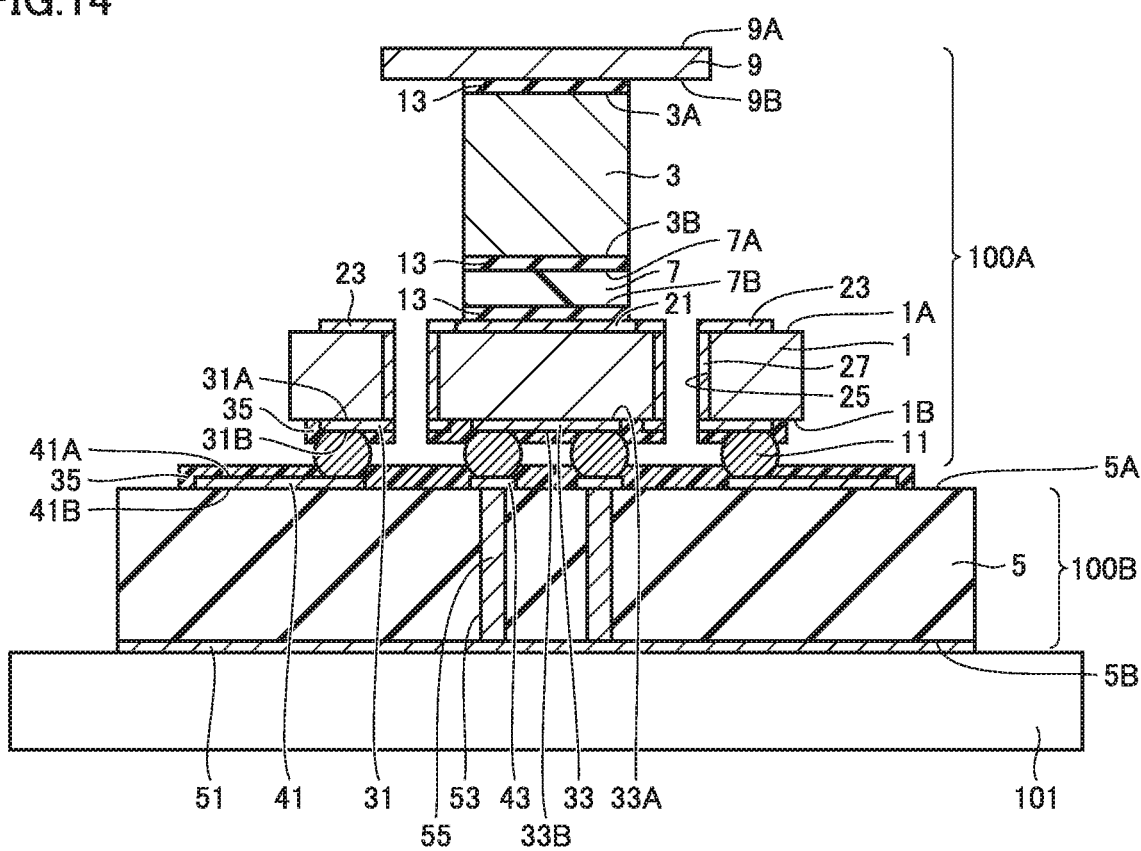
FIG. 14 is a schematic cross-sectional view showing a tenth step in a method for manufacturing the non-reciprocal circuit element in Embodiment 1.

Next, with reference to FIG. 14, the combined element body 100A and mounting board 100B, the former being mounted on the latter, is placed on hot plate 101 that has been heated to, for example, not less than 50° C. and not more than 80° C. At this time, the other main surface 5B (back-side electrode 51) of circuit board 5 is placed in contact with hot plate 101.

Figure 15:
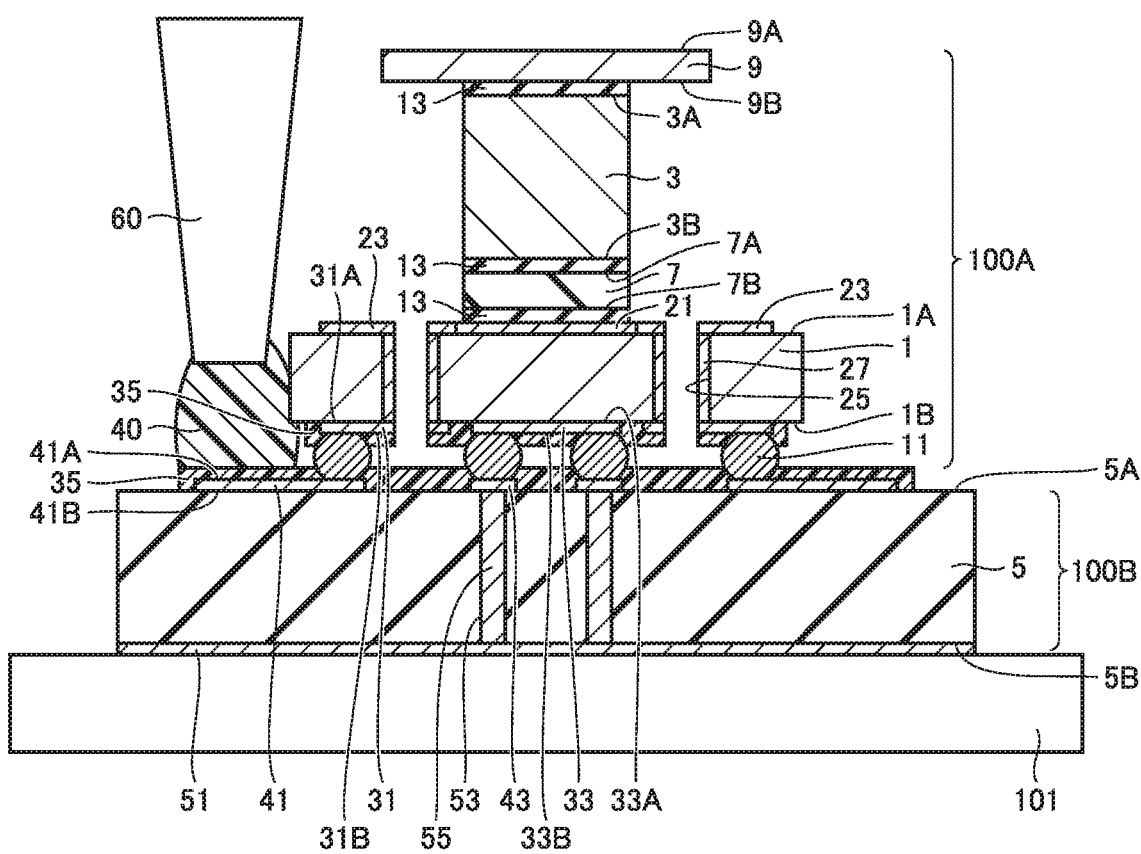
FIG. 15 is a schematic cross-sectional view showing an eleventh step in a method for manufacturing the non-reciprocal circuit element in Embodiment 1.

With reference to FIG. 15, hot plate 101 heats circuit board 5 first, and then the heat transfers to the element body 100A side. Here, before element body 100A is sufficiently heated, underfill material 40 is supplied by injection from the side of magnetic plate 1 mainly into the area between magnetic plate 1 and circuit board 5, i.e., the area adjacent to solder bumps 11 between the other main surface 1B and one main surface 5A. In other words, underfill material 40 is supplied in such a way as to fill the above-described area between magnetic plate 1 and circuit board 5 in a state where there is a temperature gradient between the surface of magnetic plate 1 and the surface of circuit board 5, specifically, in a state where the surface of circuit board 5 is higher in temperature than the surface of magnetic plate 1. At this time, the temperature difference between the surface of magnetic plate 1 and the surface of circuit board 5 is more preferably not less than 30° C., for example. A larger temperature difference leads to a larger difference in surface tension between the surface of magnetic plate 1 and the surface of circuit board 5. Accordingly, by locally cooling only magnetic plate 1, underfill material 40 that has been supplied is more stable in shape. Note that, however, the preferred temperature difference varies depending on the temperature characteristics of the viscosity of underfill material 40.

Underfill material 40 supplied in this way spreads in such a way as to avoid entering through hole 25 formed in magnetic plate 1. As a result, underfill material 40 is supplied in such a way that through hole 25 formed in magnetic plate 1 at least partially has an empty space (i.e., in such a way that through hole 25 has an empty space in which conductive film 27 is exposed).

Figure 16:
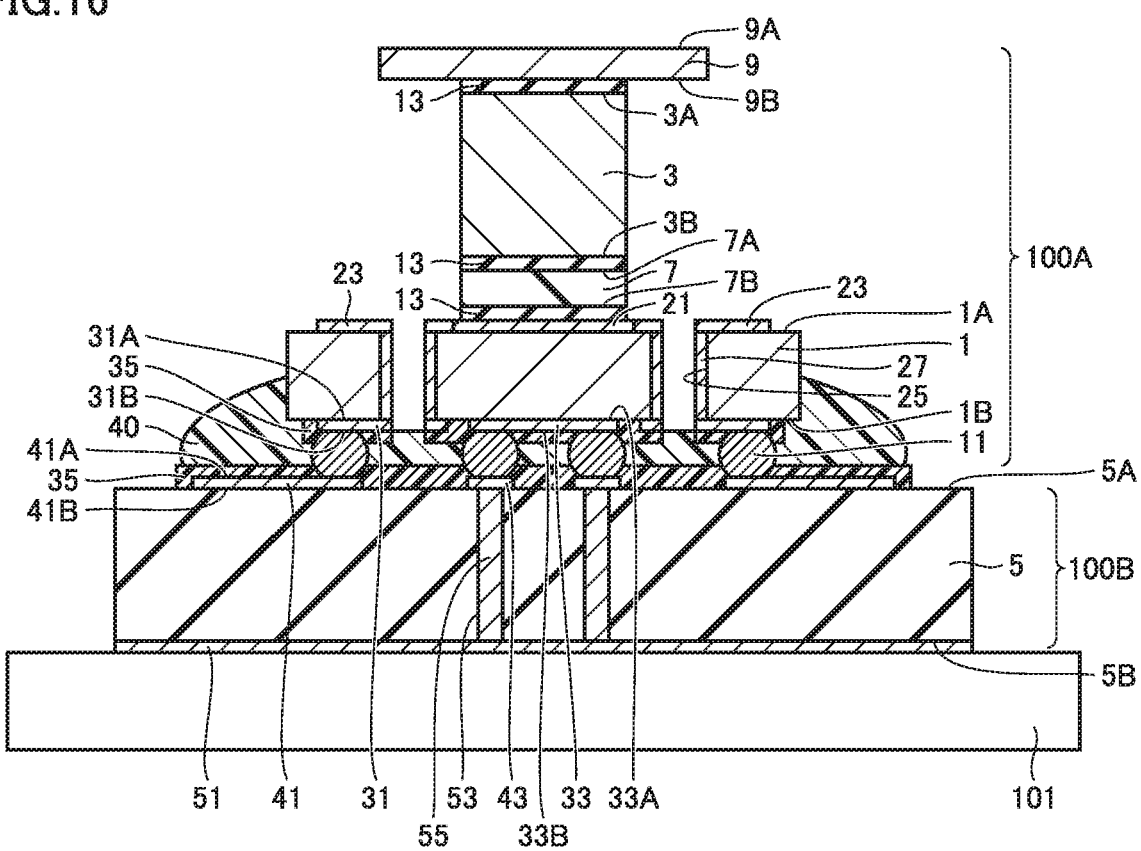
FIG. 16 is a schematic cross-sectional view showing a twelfth step in a method for manufacturing the non-reciprocal circuit element in Embodiment 1.

With reference to FIG. 16, alter underfill material 40 spreads in such a way as to fill substantially the whole area between the other main surface 1B of magnetic plate 1 and one main surface 5A of circuit board 5, underfill material 40 spreads over and wets the area having a small surface tension. Thus, a side fillet of underfill material 40 is formed on the outer circumference of magnetic plate 1.

At the point of time when the side fillet is formed, underfill material 40 has not entered through hole 25. If underfill material 40 continues to be supplied, however, the amount of supplied underfill material 40 finally exceeds the capacity that can be retained at the side fillet, thus beginning to enter through hole 25. By stopping supplying underfill material 40 immediately before the beginning of the entrance, a structure in which no underfill material 40 is contained in through hole 25 can be formed.

In the steps of FIG. 15 and FIG. 16, underfill material 40 to be supplied is generally injected into, for example, the area adjacent to the side surface of magnetic plate 1, with the use of an air-pulse dispenser 60 or the like. The injected underfill material 40 spreads in such a way as to fill tire area between magnetic plate 1 and circuit board 5 by the capillary phenomenon.

As a method of supplying underfill material 40, the one-side application is used for example, in which underfill material 40 is supplied to the area adjacent to one side of magnetic plate 1 rectangular in shape as seen in plan view, with dispenser 60 moving along the one side. As another supplying method, the two-side application may be used, in which dispenser 60 moves to draw an L shape along the area adjacent to two sides of magnetic plate 1 as seen in plan view. Alternatively, the one-point application may be used, in which underfill material 40 is supplied in the form of dots.

The one-side application and the two-side application, in which dispenser 60 moves while injecting underfill material 40 along a side(s) of magnetic plate 1 as seen in plan view, advantageously eliminate the need for waiting for underfill material 40 to penetrate, thus providing high productivity. The one-side application and the two-side application, however, require dispenser 60 to perform more complex operations compared to the one-point application, thus requiring expensive equipment. Further, the viscosity of underfill material 40 has temperature characteristics in which a higher temperature tends to provide a lower viscosity. This is because the molecules of the resin component contained in underfill material 40 move more actively in a higher-temperature environment. Lower-viscosity underfill material 40 is smaller in surface tension and better in permeability. Lower-viscosity underfill material 40, however, disadvantageously causes more application bleeding. Therefore, it is preferred that adjustments be made by, for example, selecting the head type of dispenser 60 and/or controlling the step of heating circuit board 5, in accordance with the configuration of the product to be manufactured.

Through the steps as described above, non-reciprocal circuit element 100 in the form shown in FIG. 1 can be provided.

Next, advantageous effects of the present embodiment are described.

In a non-reciprocal circuit element, there is generally a large difference in coefficient of thermal expansion between a resin circuit board and a magnetic plate immediately above the resin circuit board. Accordingly, there is a risk of breakage of the joint portion with solder bumps between the circuit board and the magnetic plate, due to a thermal stress applied to the non-reciprocal circuit element in a long-term reliability test. In view of this, the area between the other main surface of the magnetic plate and the circuit board is filled with a resin material, such as a gelatinous underfill material, as in the present embodiment. This can relax the stress at the joint portion with the solder bumps between the circuit board and the magnetic plate.

If a through hole formed in the magnetic plate of the non-reciprocal circuit element is filled with an underfill material, however, the thermal stress applied during a long-term reliability test may cause the interconnect on the inner wall surface of the through hole to be dragged and peel off by the underfill material, due to a large difference in coefficient of thermal expansion between the magnetic plate and the underfill material. Further, the thermal stress may cause breakage of the interconnect formed on the inner wall surface of the through hole.

If the through hole in the magnetic plate is filled with a metallic material, on the other hand, a very long time is required for the film formation for such filling, which may disadvantageously lead to an increased processing time for the magnetic plate.

In view of the circumstances, in the present embodiment, underfill material 40 is arranged in such a way as to fill the area between the other main surface 1B of magnetic plate 1 and circuit board 5, and through hole 25 in magnetic plate 1 (at least partially) has an empty space in which conductive film 27 is exposed.

Accordingly, the inside of through hole 25 is not filled with an insulating material (e.g. underfill material 40) which is largely different from magnetic plate 1 in coefficient of thermal expansion. This can curb the decline in adhesiveness of conductive film 27 to the inner wall surface of through hole 25, with conductive film 27 covering the inner wall surface of through hole 25. Further, since the inside of through hole 25 is not filled with a conductive film, a step that requires such long-time processing can be eliminated and thus productivity can be enhanced.

Underfill material 40 can be prevented from entering through hole 25 by supplying underfill material 40 in a state where there is a temperature gradient between the surface of magnetic plate 1 and the surface of circuit board 5. This is because, when mounting board 100B is higher in temperature than element body 100A, underfill material 40 is more wettable selectively on the mounting board 100B side (i.e., the circuit board 5 side) than on the element body 100A side. Thus, in the step of supplying underfill material 40, underfill material 40 can be controlled so as not to enter the inside of through hole 25 from the other main surface 1B side of magnetic plate 1.

Embodiment 2

Figure 17:
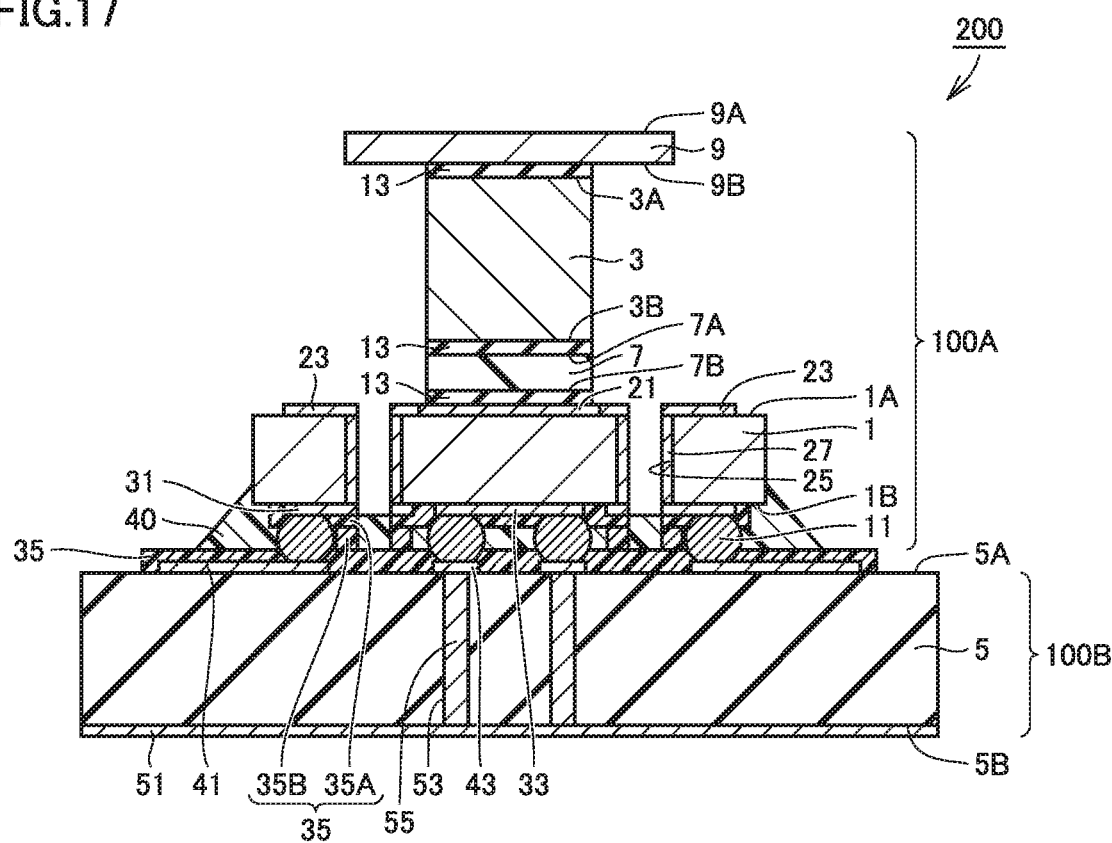
FIG. 17 is a schematic cross-sectional view showing a configuration of a non-reciprocal circuit element in Embodiment 2.

With reference to FIG. 17, a non-reciprocal circuit element 200 in the present embodiment is basically the same in configuration as non-reciprocal circuit element 100 in Embodiment 1. Therefore, for non-reciprocal circuit element 200, the same components as those of non-reciprocal circuit element 100 are identically denoted, and the description of such components are not repeated. The present embodiment, however, is different from Embodiment 1 in that solder resist 35 provided on the other main surface 1B of magnetic plate 1 comprises a plurality of stacked layers at the area adjacent to through hole 25.

Figure 18:
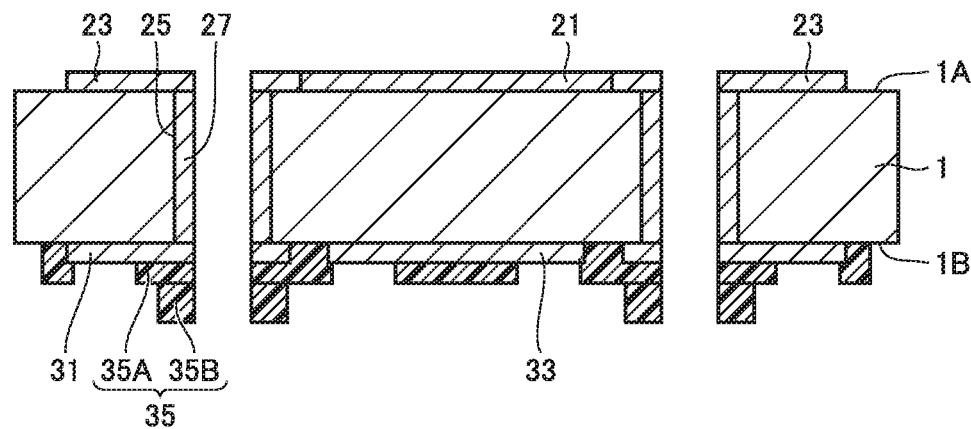
FIG. 18 is a schematic cross-sectional view showing one step in a method for manufacturing the non-reciprocal circuit element in Embodiment 2.

FIG. 18 shows an enlarged magnetic plate 1 in non-reciprocal circuit element 200 of FIG. 17. With reference to FIG. 17 and FIG. 18, solder resist 35 is configured with two layers, solder resist 35A and solder resist 35B, stacked in this order from the side adjacent to the other main surface 1B. The number of layers constituting solder resist 35, however, may be three or more. Solder resist 35B is formed only at the area adjacent to (close to) through hole 25, and the other area in solder resist 35 consists of only one layer, solder resist 35A. Accordingly, the surface of solder resist 35 at the bottom of FIG. 17 is not flat, but has a level difference between the two-layer area and the one-layer area.

In the case of Embodiment 1 in which a single-layer solder resist 35 is formed, a pad electrode such as input/output terminal 31 is formed on the other main surface 1B at the area adjacent to through hole 25, and solder resist 35 is formed in such a way as to partially overlie this pad electrode. Accordingly, solder resist 35 may include a level difference between the area that overlies the pad electrode and the area that does not overlie the pad electrode. However, in Embodiment 1, for example liquid solder resist 35 is supplied by the screen printing to the other main surface 1B in such a way as to overlie the pad electrode, as described above. Thus, even if there is a level difference due to the pad electrode that has already been formed, the pattern of solder resist 35 formed thereon is naturally smoothed into an almost flat surface.

If a sharp level difference equivalent to that of the present embodiment is to be created by single-layer solder resist 35 overlying the pad electrode, a very thick unpractical pad electrode would be required. This is usually unlikely. For this reason, in Embodiment 1, solder resist 35 overlying the pad electrode is shown with a flat surface.

The level difference accidentally formed by single-layer solder resist 35 overlying the pad electrode as in Embodiment 1, and the level difference deliberately formed by stacking a plurality of solder resists 35A and 35B as in the present embodiment are distinguishable by observation of the actual thing. The reason is that solder resist 35 configured with a stack of a plurality of layers as in the present embodiment has a level-difference portion whose curvature cannot be expected from the level difference of single-layer solder resist 35 of Embodiment 1.

Next, a method for producing solder resist 35 on magnetic plate 1, in which the present embodiment is different from Embodiment 1, is described with reference to FIG. 18. Note that the steps other than the step of producing solder resist 35 are basically equivalent to those of Embodiment 1 (except that the temperature control during supply of underfill material 40 is not necessarily preformed as described later). Therefore, the detailed description is not repeated.

With reference to FIG. 18, similarly to Embodiment 1, solder resist 35A is formed by the screen printing on the other main surface 1B of magnetic plate 1 on which input/output terminal 31 and grounding electrode 33 have been formed, and then solder resist 35B is formed to overlie solder resist 35A at the area adjacent to through hole 25. In this way, a plurality of solder resists 35A and 35B are stacked at the area adjacent to through hole 25.

If the screen printing is used to form solder resist 35 having such a stack structure, for example two types of masks for printing may be used to form the structure having a level difference between solder resist 35A and solder resist 35B. If the photolithography is used to form solder resist 35 having such a stack structure, two types of masks for exposure and development may be preferably used.

Next, the advantageous effects of the present embodiment are described. The present embodiment brings about the following advantageous effects in addition to those of Embodiment 1.

In the present embodiment, solder resist 35 is formed with a greater thickness at the area adjacent to through hole 25 than at the other areas. This provides a greater surface tension to the area on the other main surface 1B adjacent to through hole 25 against underfill material 40. Therefore, in the step of supplying underfill material 40 shown in FIG. 15 for example, underfill material 40 can be more effectively prevented from entering through hole 25 from the other main surface 1B side than in Embodiment 1. This eliminates the need for precise control, such as the control for providing a temperature gradient between the surface of circuit board 5 and the surface of magnetic plate 1 during supply of underfill material 40 as in Embodiment 1. Therefore, highly reliable non-reciprocal circuit element 200 can be manufactured by simpler processes.

Embodiment 3

Figure 19:
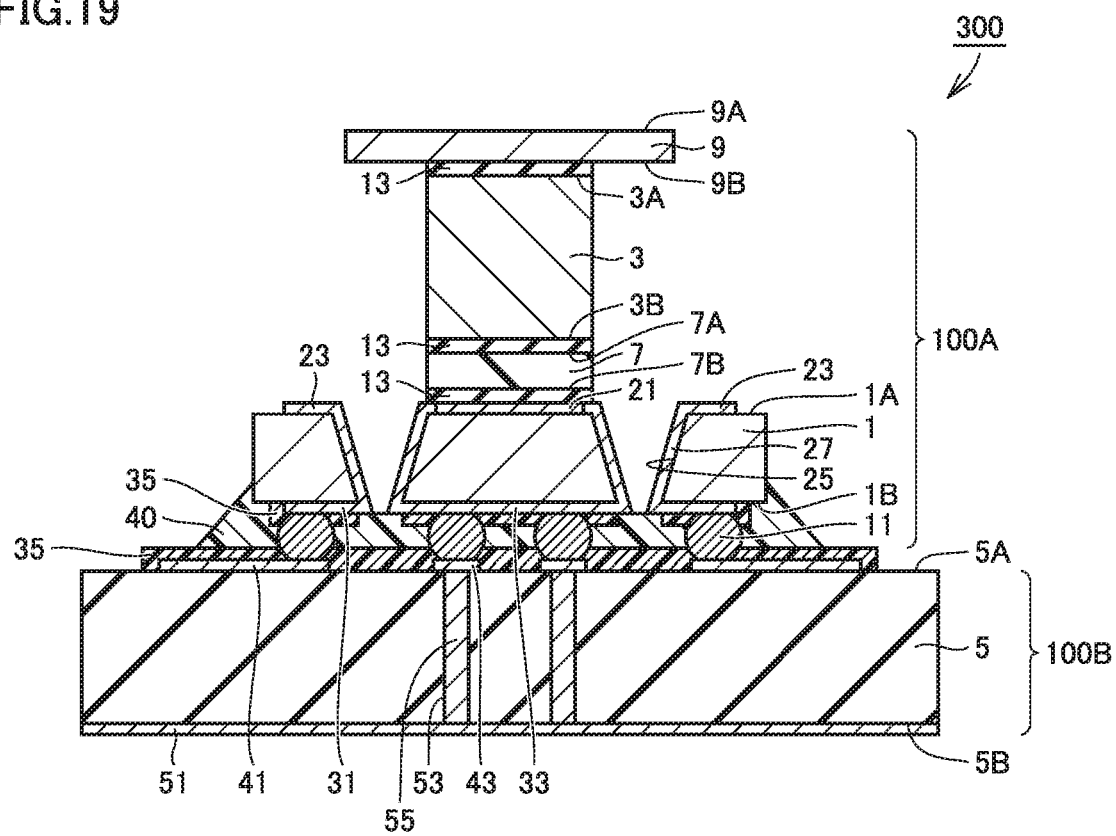
FIG. 19 is a schematic cross-sectional view showing a configuration of a non-reciprocal circuit element in Embodiment 3.

With reference to FIG. 19, a non-reciprocal circuit element 300 in the present embodiment is basically the same in configuration as non-reciprocal circuit element 100 in Embodiment 1. Therefore, for non-reciprocal circuit element 300, the same components as those of non-reciprocal circuit element 100 are identically denoted, and the description of such components are not repeated. The present embodiment, however, is different from Embodiment 1 in that the inner wall surface of through hole 25 that extends from one main surface 1A to the other main surface 1B of magnetic plate 1 inclines relative to the other main surface 1B of magnetic plate 1. Specifically, with reference to FIG. 20, the other main surface 1B and inner wall surface of through hole 25 define an acute angle α of not more than 70°.

Through hole 25 is formed in such a way that the dimension D2 of the opening portion on the other main surface 1B side is smaller than the dimension D1 of the opening, portion on the one main surface 1A side, as well in plan view. Thus, through hole 25 has a generally drum-shaped cross section.

Specifically, in the present embodiment, the inner wall surface of through hole 25 has a taper shape with respect to a perpendicular line to the other main surface 1B.

Figure 20:
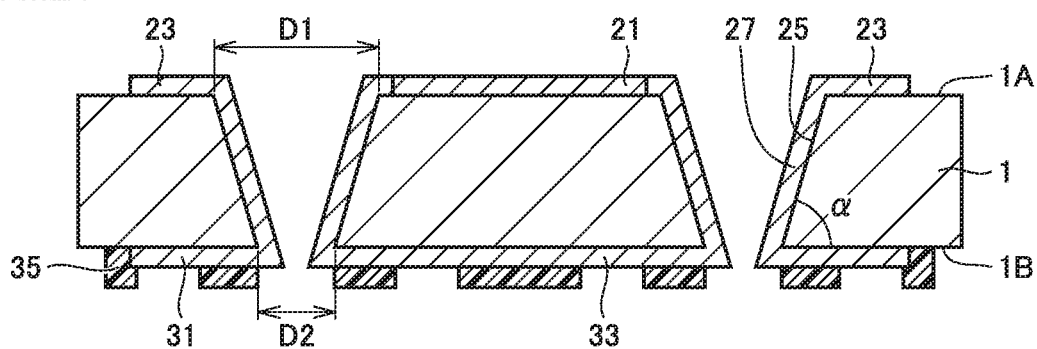
FIG. 20 is a schematic cross-sectional view showing one step in a method for manufacturing the non-reciprocal circuit element in Embodiment 3.

In FIG. 19 and FIG. 20, through hole 25 is formed to have a taper shape generally from one main surface 1A to the other main surface 1B. However, through hole 25 may preferably be formed to have a such a taper shape at least at the area adjacent to the other main surface 1B.

Next, a method for producing tapered through hole 25, in which the present embodiment is different from Embodiment 1, is described with reference to FIG. 20. Note that the steps other than the step of forming through hole 25 are basically equivalent to those of Embodiment 1 (except that the temperature control during supply of underfill material 40 is not necessarily preformed as described later). Therefore, the detailed description is not repeated.

With reference to FIG. 20, through hole 25 is formed by the sandblasting for example, from one main surface 1A of magnetic plate 1. Specifically, abrasive grain for removal processing is jetted to one main surface 1A to cut off magnetic plate 1 to form through hole 25. By adjusting the type of abrasive grain and the jetting pressure in this processing, through hole 25 can be formed in such a way that acute angle α defined by through hole 25 and the other main surface 1B is any angle not more than 70°.

In this way, through hole 25 is formed in such a way that the inner wall surface of through hole 25 in magnetic plate 1 inclines relative to the other main surface 1B, and in such a way that the dimension of through hole 25 on the other main surface 1B side is smaller than that of the one main surface 1A side as seen in plan view.

Next, the advantageous effects of the present embodiment are described. The present embodiment brings about the following advantageous effects in addition to those of Embodiment 1.

In the present embodiment, the inner wall surface of through hole 25 inclines in such a way that its dimension on the other main surface 1B side is smaller than that of the one main surface 1A side. This provides a greater surface tension to the intersection of through hole 25 and the other main surface 1B against underfill material 40. Therefore, in the step of supplying underfill material 40 shown in FIG. 15 for example, underfill material 40 can be more effectively prevented from entering through hole 25 from the other main surface 1B side than in Embodiment 1. This eliminates the need for precise control, such as the control for providing a temperature gradient between the surface of circuit board 5 and the surface of magnetic plate 1 during supply of underfill material 40 as in Embodiment 1. Therefore, highly reliable non-reciprocal circuit element 300 can be manufactured by simpler processes.

Embodiment 4

Figure 21:
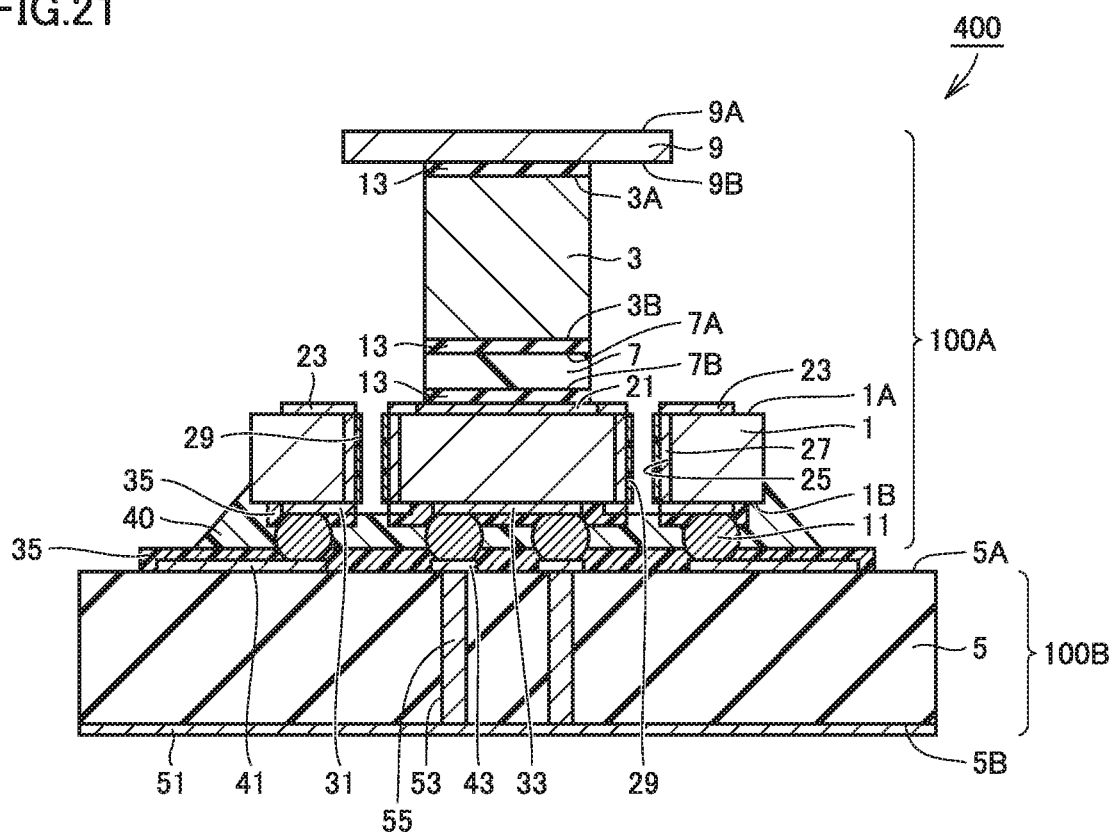
FIG. 21 is a schematic cross-sectional view showing a configuration of a non-reciprocal circuit element in Embodiment 4.

With reference to FIG. 21, a non-reciprocal circuit element 400 in the present embodiment is basically the same in configuration as non-reciprocal circuit element 100 in Embodiment 1. Therefore, for non-reciprocal circuit element 400, the same components as those of non-reciprocal circuit element 100 are identically denoted, and the description of such components are not repeated. The present embodiment, however, is different from Embodiment 1 in that a fluororesin coat 29 for example is formed on the inner wall surface of through hole 25.

Although coat 29 may be formed on the entire inner wall surface of through hole 25, it is preferred that coat 29 be preferentially formed particularly at the area adjacent to the other main surface 1B, of the inner wall surface of through hole 25.

Next, a method for forming coat 29, in which the present embodiment is different from Embodiment 1, is described with reference to FIG. 22. Note that the steps other than the step of forming coat 29 are basically equivalent to those of Embodiment 1 (except that the temperature control during supply of underfill material 40 is not necessarily preformed as described later). Therefore, the detailed description is not repeated.

Figure 22:
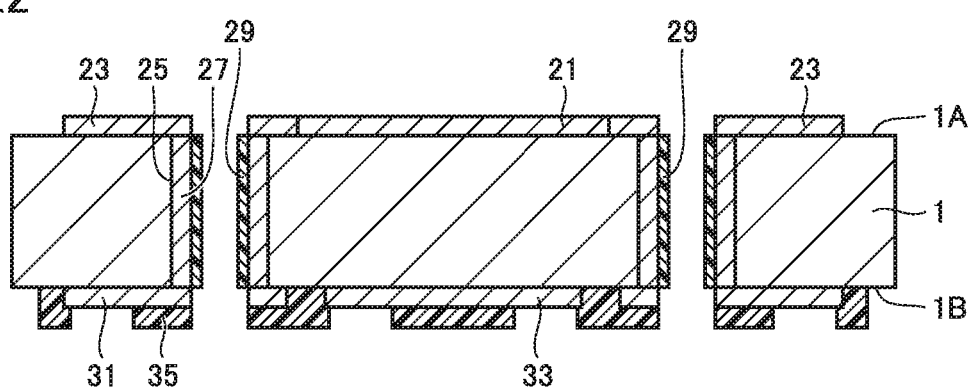
FIG. 22 is a schematic cross-sectional view showing one step in a method for manufacturing the non-reciprocal circuit element in Embodiment 4.

With reference to FIG. 22, the inner wall surface of through hole 25 is applied with a commonly-known water repellent finish. Through this treatment, coat 29 is formed as a water-repellent film on the inner wall surface of through hole 25.

Next, the advantageous effects of the present embodiment are described. The present embodiment brings about the following advantageous effects in addition to those of Embodiment 1.

In the present embodiment, the inner wall surface of through hole 25 is applied with a water repellent finish or the like, thereby provided with fluororesin coat 29 formed thereon. Thus, coat 29 can repel underfill material 40 on the inner wall surface of through hole 25. Therefore, similarly to Embodiments 2 and 3, underfill material 40 can be more effectively prevented from entering through hole 25 from the other main surface 1B side, thus eliminating the need for precise temperature control of magnetic plate 1 and circuit board 5 during supply of underfill material 40. Therefore, highly reliable non-reciprocal circuit element 400 can be manufactured by simpler processes.

The technical features of the embodiments described above may be combined as appropriate if technically compatible.

It should be understood that the embodiments disclosed herein are illustrative in every respect, not limitative. The scope of the present invention is defined not by the above description but by the terms of the claims, and is intended to encompass any modification within the meaning and scope equivalent to the terms of the claims.

REFERENCE SIGNS LIST

1: magnetic plate; 1A, 3A, 5A, 7A, 9A: one main surface; 1B, 3B, 5B, 7B, 9B: the other main surface; 3: magnet, 5: circuit board; 7: dielectric component; 9: magnetic yoke; 11: solder bump; 21: central electrode; 23: interconnect; 25, 53: through hole; 27, 55: conductive film; 29: coat; 31: input/output terminal; 33: grounding electrode; 35: solder resist; 40: underfill material; 41: pad electrode; 43: circuit-board central electrode; 51: back-side electrode; 60: dispenser; 100, 200, 300, 400; non-reciprocal circuit element, 100A: element body; 100B: mounting board, 101: hot plate; 103: roller; 104: pressure clip; 105: flux.

The invention claimed is:

1. A non-reciprocal circuit element comprising:
a magnetic plate having one main surface and an other main surface on a side opposite to the one main surface, the magnetic plate including a plurality of input/output terminals;
a permanent magnet connected to the one main surface of the magnetic plate;
a circuit board connected to the other main surface of the magnetic plate, with a solder bump lying between the circuit board and the other main surface, the circuit board including a plurality of signal conductors; and
an underfill material arranged between the magnetic plate and the circuit board,
the magnetic plate having a through hole formed therein, the through hole extending from the one main surface to the other main surface,
the through hole having an empty space in which at least a part of a conductive film arranged in the through hole is exposed, said empty space opening at a portion of the one main surface which is not covered by the permanent magnet.

2. The non-reciprocal circuit element according to claim 1, further comprising a solder resist on the other main surface of the magnetic plate, wherein
a plurality of the solder resists are stacked at an area adjacent to the through hole.

3. The non-reciprocal circuit element according to claim 1, wherein
an inner wall surface of the through hole extending from the one main surface to the other main surface of the magnetic plate inclines relative to the other main surface of the magnetic plate, and
as seen in plan view, the through hole is smaller in dimension at the other main surface than at the one main surface.

4. The non-reciprocal circuit element according to claim 1, wherein a fluororesin coat is formed on an inner wall surface of the through hole.

5. A method for manufacturing a non-reciprocal circuit element, the method comprising:
forming a magnetic plate having one main surface and an other main surface on a side opposite to the one main surface, the magnetic plate including a plurality of input/output terminals;
forming a through hole extending from the one main surface to the other main surface of the magnetic plate;
connecting a permanent magnet to the one main surface of the magnetic plate;
connecting a circuit board including a plurality of signal conductors to the other main surface of the magnetic plate, with a solder bump lying between the circuit board and the other main surface; and supplying an underfill material between the magnetic plate and the circuit board, in the supplying of the underfill material, the underfill material is supplied in such a way that the through hole formed in the magnetic plate has an empty space in which at least a part of a conductive film arranged in the through hole is exposed, said empty space opening at a portion of the one main surface which is not covered by the permanent magnet.

6. The method for manufacturing a non-reciprocal circuit element according to claim 5, wherein, in the supplying of the underfill material, the underfill material is supplied in a state where there is a temperature gradient between a surface of the magnetic plate and a surface of the circuit board.

7. The method for manufacturing a non-reciprocal circuit element according to claim 5, further comprising forming a solder resist on the other main surface of the magnetic plate, wherein in the forming of the solder resist, a plurality of the solder resists are stacked at an area adjacent to the through hole.

8. The method for manufacturing a non-reciprocal circuit element according to claim 5, wherein, in the forming of the through hole, the through hole is formed in such a way that:

an inner wall surface of the through hole extending from the one main surface to the other main surface of the magnetic plate inclines relative to the other main surface of the magnetic plate; and as seen in plan view, the through hole is smaller in dimension at the other main surface than at the one main surface.

9. The method for manufacturing a non-reciprocal circuit element according to claim 5, further comprising providing a water repellent finish to an inner wall surface of the through hole.

* * * * *